United States Patent
Yoon et al.

(10) Patent No.: US 10,522,682 B2
(45) Date of Patent: Dec. 31, 2019

(54) SEMICONDUCTOR DEVICE

(71) Applicant: Samsung Electronics Co., Ltd., Suwon-si (KR)

(72) Inventors: Chang Seop Yoon, Suwon-si (KR); Byung Ha Choi, Suwon-si (KR); Dae Geun Kim, Yesan-gun (KR); Su Min Kim, Suwon-si (KR); Se Wan Park, Seoul (KR); Ji Ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/869,522

(22) Filed: Jan. 12, 2018

(65) Prior Publication Data
US 2019/0043981 A1 Feb. 7, 2019

(30) Foreign Application Priority Data
Aug. 4, 2017 (KR) .......................... 10-2017-0098997

(51) Int. Cl.
| | | |
|---|---|---|
| *H01L 29/78* | (2006.01) | |
| *H01L 21/768* | (2006.01) | |
| *H01L 29/417* | (2006.01) | |
| *H01L 27/088* | (2006.01) | |
| *H01L 21/8238* | (2006.01) | |
| *H01L 27/092* | (2006.01) | |

(52) U.S. Cl.
CPC ...... *H01L 29/785* (2013.01); *H01L 21/76834* (2013.01); *H01L 21/823821* (2013.01); *H01L 27/0886* (2013.01); *H01L 27/0924* (2013.01); *H01L 29/41791* (2013.01)

(58) Field of Classification Search
None
See application file for complete search history.

(56) References Cited

U.S. PATENT DOCUMENTS

| | | | |
|---|---|---|---|
| 6,159,781 A * | 12/2000 | Pan | H01L 21/28114 |
| | | | 257/E21.205 |
| 8,629,512 B2 | 1/2014 | Liaw | |
| 9,136,356 B2 | 9/2015 | Lin et al. | |
| 9,166,053 B2 | 10/2015 | Kuo et al. | |
| 9,269,813 B2 | 2/2016 | Hong et al. | |
| 9,425,317 B1 | 8/2016 | Wen et al. | |
| 9,443,979 B2 | 9/2016 | Park et al. | |
| 2008/0296667 A1 | 12/2008 | Mikasa | |
| 2012/0306026 A1 * | 12/2012 | Guo | H01L 29/495 |
| | | | 257/407 |
| 2013/0193513 A1 | 8/2013 | Bryant et al. | |

(Continued)

*Primary Examiner* — Anthony Ho
*Assistant Examiner* — Kevin Quinto
(74) *Attorney, Agent, or Firm* — Myers Bigel, P.A.

(57) ABSTRACT

A semiconductor device is provided. The semiconductor device includes a fin type pattern, a field insulating film on a part of a sidewall of the fin-type pattern, and a gate electrode intersecting with the fin-type pattern, on the fin-type pattern and the field insulating film. The gate electrode on the field insulating film includes a first portion, a second portion, and a third portion on the field insulating film. A first width of the first portion increases as a first distance from the field insulating film, increases width of the second portion decreases as a second distance from the field insulating film increases, and a third width of the third portion increases or is substantially constant as a third distance from the field insulating film increases.

19 Claims, 22 Drawing Sheets

(56) References Cited

U.S. PATENT DOCUMENTS

| | | | |
|---|---|---|---|
| 2016/0204215 A1* | 7/2016 | Chang | H01L 21/845 |
| | | | 257/401 |
| 2016/0204264 A1 | 7/2016 | You et al. | |
| 2016/0254385 A1* | 9/2016 | Wen | H01L 29/7856 |
| | | | 257/401 |
| 2016/0307927 A1 | 10/2016 | Lee et al. | |
| 2017/0098711 A1 | 4/2017 | Hsiao et al. | |

* cited by examiner

US 10,522,682 B2

SEMICONDUCTOR DEVICE

CROSS-REFERENCE TO RELATED APPLICATIONS

This application claims priority under 35 U.S.C § 119 to Korean Patent Application No. 10-2017-0098997 filed on Aug. 4, 2017, in the Korean Intellectual Property Office, the disclosure of which is hereby incorporated in its entirety by reference.

FIELD OF THE INVENTION

The present inventive concept relates to a semiconductor device. More particularly, the present inventive concept relates to a multi-gate transistor.

BACKGROUND

As a scaling technique for enhancing the density of a semiconductor device, a multi-gate transistor has been proposed in which a fin-like silicon body is formed on a substrate and a gate is formed on a surface of a silicon body.

Since such a multi-gate transistor utilizes three-dimensional channels, it may be easily scaled. Further, the current control capability can be improved even without increasing the gate length of the multi-gate transistor. Furthermore, it is possible to effectively suppress SCE (short channel effect) in which the potential of the channel region is affected by the drain voltage.

SUMMARY

Some embodiments of the present inventive concept provide a semiconductor device with improved performance and product reliability.

Embodiments of the present inventive concept are not limited to those mentioned above and other embodiments which have not been discussed may be derived by those skilled in the art from the description below.

According to some embodiments of the present inventive concept, there is provided a semiconductor device including, a fin type pattern, a field insulating film disposed on a part of a sidewall of the fin-type pattern, and a gate electrode on the fin-type pattern and the field insulating film. The gate electrode includes a first portion, a second portion, and a third portion that are on the field insulating film. A first width of the first portion increases as a first distance from the field insulating film increases, a second width of the second portion decreases as a second distance from the field insulating film increases, and a third width of the third portion increases or is substantially constant as a third distance from the field insulating film increases. The first distance is less than the second distance and the second distance is less than the third distance.

According to aspects of the present inventive concept, there is provided a semiconductor device comprising a fin-type pattern extending along a first direction, a field insulating film on a part of a sidewall of the fin-type pattern, an interlayer insulating film on the field insulating film and surrounding a trench on the fin-type pattern. The trench extends along a second direction intersecting with the first direction and includes a triangular flask-shaped cross-section. A gate spacer extends along a sidewall of the trench and a gate insulating film extends along a sidewall of the gate spacer and a bottom surface of the trench. A gate electrode is on the gate insulating film.

According to aspects of the present inventive concept, there is provided a semiconductor device including a fin-type pattern, a field insulating film on a part of the sidewalls of the fin-type pattern, and a gate electrode on the field insulating film. A cross section of the gate electrode intersecting with the second direction has a triangular flask shape, and the sidewalls of the gate electrode include a crest.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Hereinafter, a semiconductor device according to some embodiments of the present inventive concept will be described with reference to FIGS. 1 to 5.

Figure 1:
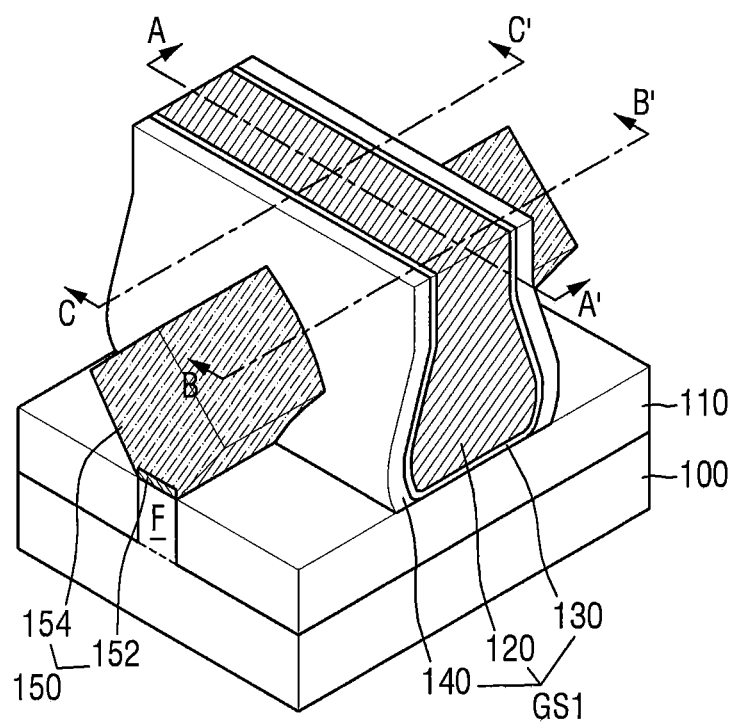
FIG. 1 is a perspective view of a semiconductor device according to some embodiments of the present inventive concept.
Figure 2:
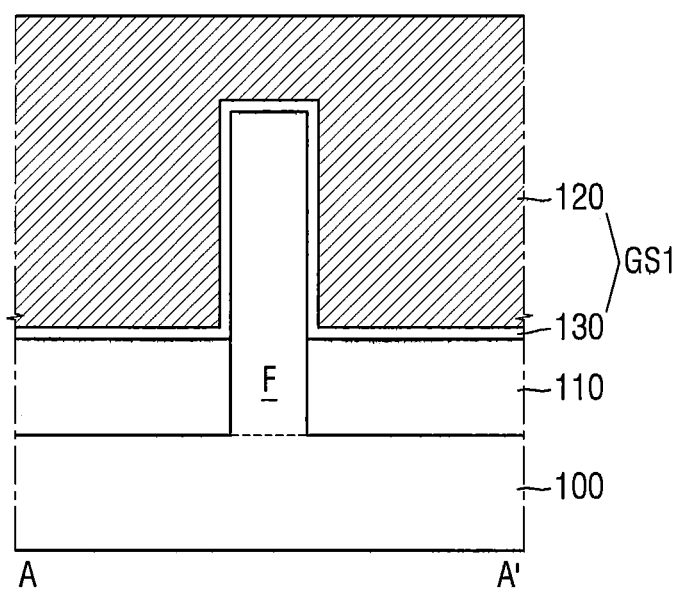
FIG. 2 is a cross-sectional view taken along line A-A' of FIG. 1, according to some embodiments of the present inventive concept.
Figure 2:
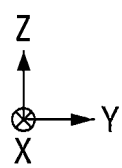
Figure 3A:
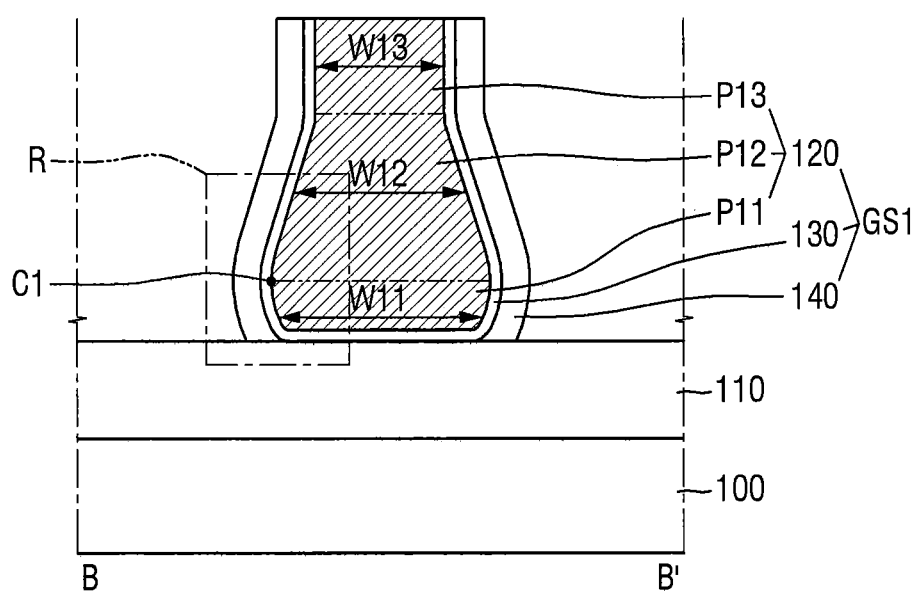
FIGS. 3a and 3b are cross-sectional views taken along line B-B' of FIG. 1, according to some embodiments of the present inventive concept.
Figure 3B:
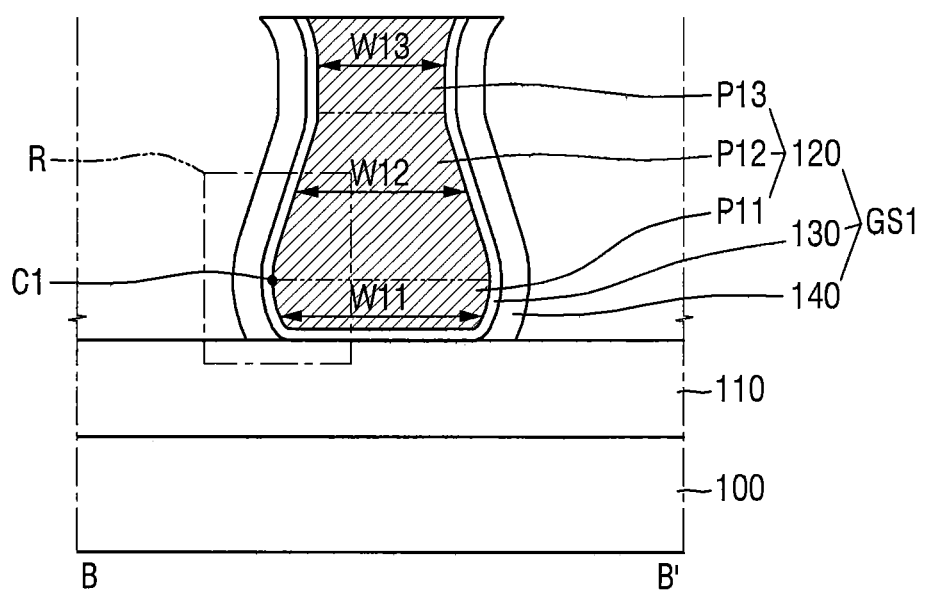
Figure 3B:
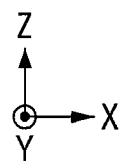
Figure 4:
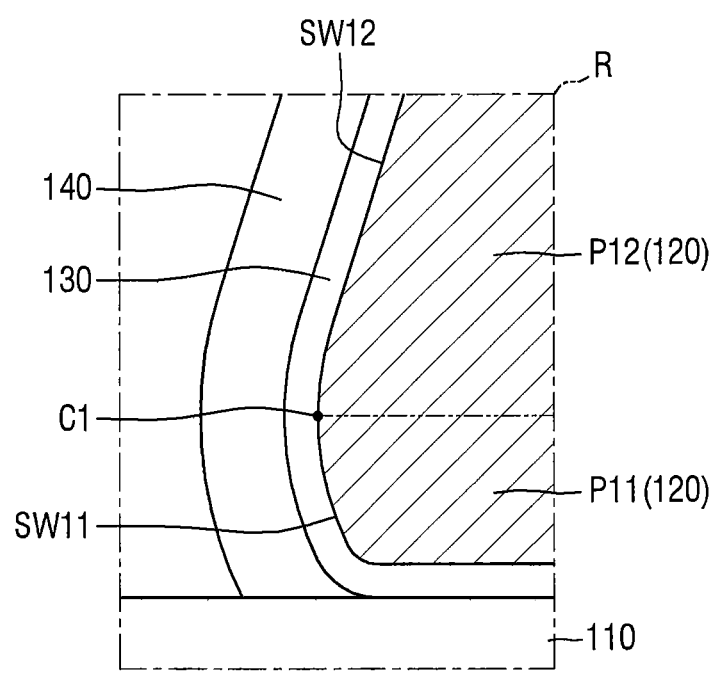
FIG. 4 is an enlarged view of a region R of FIGS. 3a and 3b, according to some embodiments of the present inventive concept.
Figure 5:
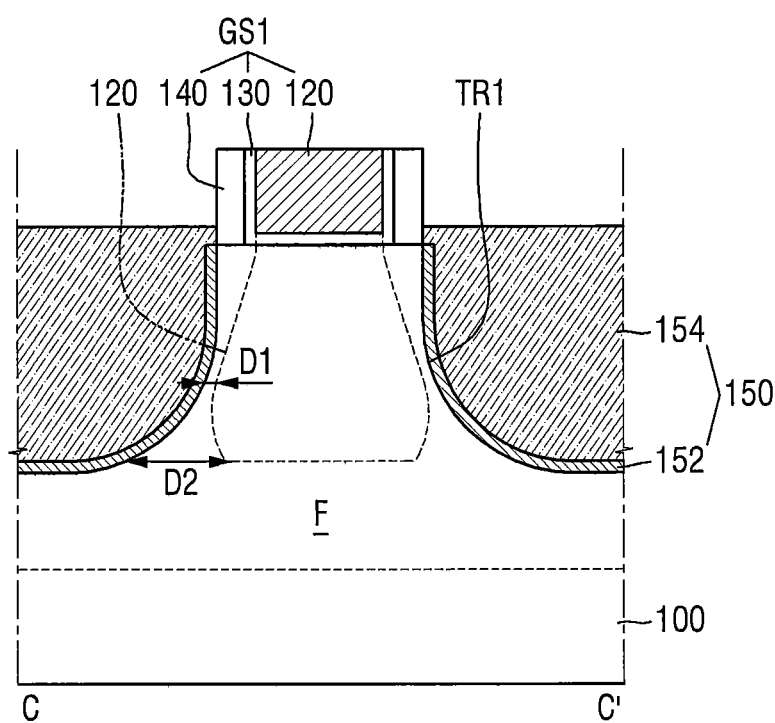
FIG. 5 is a cross-sectional view taken along line C-C' of FIG. 1, according to some embodiments of the present inventive concept.

FIG. 1 is a perspective view of a semiconductor device according to some embodiments of the present inventive concept. FIG. 2 is a cross-sectional view taken along line A-A' of FIG. 1. FIGS. 3a and 3b are cross-sectional views taken along line B-B' of FIG. 1. FIG. 4 is an enlarged view of a region R of FIGS. 3a and 3b. FIG. 5 is a cross-sectional view taken along line C-C' of FIG. 1.

Referring to FIGS. 1 to 5, a semiconductor device according to some embodiments of the present inventive concept includes a substrate 100, a fin-type pattern F, a field insulating film 110, a first gate structure GS1, and an epitaxial pattern 150.

The substrate 100 may be, for example, bulk silicon or silicon-on-insulator (SOI). The substrate 100 may be a silicon substrate or may include other materials, such as silicon germanium, indium antimonide, lead tellurium compounds, indium arsenide, indium phosphide, gallium arsenide or gallium antimonide. Or, the substrate 100 may have an epitaxial layer formed on a base substrate.

The fin-type pattern F may protrude from the top of the substrate 100 to extend long. For example, as illustrated in FIG. 1, the fin-type pattern F may extend long along a first direction X. Specifically, the fin-type pattern F may have a short side and a long side, respectively. In FIG. 1, the short side of the fin-type pattern F extends along a second direction Y, and the long side of the fin-type pattern F extends along the first direction X.

The fin-type pattern F may be a part of the substrate 100 and/or may also include an epitaxial layer that is grown from the substrate 100. The fin-type pattern F may include, for example, silicon or germanium which is an elemental semiconductor material. Further, the fin-type pattern F may include a compound semiconductor such as, for example, a group IV-IV compound semiconductor or a group III-V compound semiconductor.

In a case where the fin-type pattern F includes a group IV-IV compound semiconductor, the fin-type pattern F may include a binary compound or a ternary compound containing at least two or more of carbon (C), silicon (Si), germanium (Ge), and tin (Sn), or a compound obtained by doping these elements with a group IV element. In a case where the fin-type pattern F includes a group III-V compound semiconductor, the fin-type pattern F may be a binary compound, a ternary compound, or a quaternary compound formed by combining at least one of aluminum (Al), gallium (Ga) and indium (In) as a group III element with one of phosphorus (P), arsenic (As), and antimonium (Sb) as a group V element. In the semiconductor device according to some embodiments, the fin-type pattern F is described as a silicon fin-type pattern including silicon.

The fin-type pattern F may be included in a channel region of a transistor including the first gate electrode 120. In the present specification, the channel region of the transistor including the first gate electrode 120 is described as including the fin-type pattern F, but the present inventive disclosure is not limited thereto. For example, the channel region of the transistor including the first gate electrode 120 may include a nanowire pattern, a nano sheet pattern, or the like.

The field insulating film 110 may cover a part of the sidewalls of the fin-type pattern F on the substrate 100. In FIG. 1, the top surface of the field insulating film 110 may be disposed on the same plane as a part of the top surface of the fin-type pattern F, but the present inventive disclosure is not limited thereto. For example, a part of the top surface of the fin-type pattern F may protrude upward from the field insulating film 110.

The field insulating film 110 may include, for example, at least one of an oxide film, a nitride film, an oxynitride film, or a combination thereof, but the present inventive disclosure is not limited thereto.

The first gate structure GS1 may be formed on the fin-type pattern F to intersect with the fin-type pattern F. For example, the first gate structure GS1 may extend on the fin-type pattern F along the second direction Y.

The first gate structure GS1 may include a first gate electrode 120, a first gate insulating film 130, and a first gate spacer 140.

As illustrated in FIGS. 3a and 3b, the first gate electrode 120 on the field insulating film 110 may have a triangular flask shape. For example, the first gate electrode 120 on the field insulating film 110 may include a first portion P11, a second portion P12, and a third portion P13, which are sequentially disposed on the field insulating film 110.

The first portion P11 may be disposed below and/or towards the bottom of the first gate electrode 120. A width W11 of the first portion P11 may increase with distance away from the field insulating film 110. That is, the width W11 of the first portion P11 may increase as it goes upward along a third direction Z. Here, the width means the width of the first gate electrode 120 in the first direction X.

In some embodiments, at least a part of the sidewall of the first portion P11 may have a convex shape. For example, as illustrated in FIG. 4, the first portion P11 may include a first sidewall SW11 having a convex slope. At this time, since the width W11 of the first portion P11 increases as it goes away from the field insulating film 110, an absolute value of the slope formed by the first sidewall SW11 may increase with distance from the field insulating film 110.

The second portion P12 may be disposed on the first portion P11. A width W12 of the second portion P12 may decrease with distance from the field insulating film 110. That is, the width W12 of the second portion P12 may gradually decrease as it goes upward along the third direction Z.

In some embodiments, at least a part of the sidewall of the second portion P12 may have a convex shape. For example, as illustrated in FIG. 4, the second portion P12 may include a second sidewall SW12 having a convex slope. At this time, since the width W12 of the second portion P12 decreases with distance from the field insulating film 110, the absolute value of the slope formed by the second side wall SW12 may decrease with distance from the field insulating film 110.

Further, the sidewall of the first gate electrode 120 may include a crest. For example, the first portion P11 and the second portion P12 may be in direct contact with each other. At this time, a first crest C1 may be formed at a point of the sidewall of the first gate electrode 120 where the first portion P11 and the second portion P12 are in contact with each other. For example, the first sidewall SW11 and the second sidewall SW12 may be in contact with each other to form the first crest C1. The first crest C1 may be a portion protruding farthest in the first direction X from the sidewall of the first gate electrode 120 having the convex slope. The first crest C1 may be at a widest width of the first gate electrode 120.

The third portion P13 may be arranged on the second portion P12. A width W13 of the third portion P13 may increase or may be substantially constant with distance from the field insulating film 110. That is, the width W13 of the third portion P13 may increase or may be substantially constant as it goes upward along the third direction Z.

For example, as illustrated in FIG. 3a, the width W13 of the third portion P13 may be substantially constant as it goes away from the field insulating film 110. As a result, the sidewall of the third portion P13 may be perpendicular to the top surface of the field insulating film 110. In the present specification, the term "constant" means not only completely constant but also including minute differences that may occur due to process margins and the like.

In some embodiments, the third portion P13 may include a portion whose width increases as it goes away from the field insulating film 110. For example, as illustrated in FIG. 3b, the width W13 of the third portion P13 may be substantially constant and then may increase with distance from the field insulating film 110.

In some embodiments, at least a part of the sidewall of the third portion P13 may have a concave slope. At this time, since the width W13 of the third portion P13 increases with distance from the field insulating film 110, the absolute value of the slope formed by the sidewall of the third portion P13 may decrease with distance from the field insulating film 110.

In some embodiments, the second portion P12 may be arranged to be lower than the top surface of the fin-type pattern F, and the third portion P13 may be arranged to be higher than the top surface of the fin-type pattern F. For example, the top surface of the second portion P12 may be lower than or the same as the top surface of the fin-type pattern F, and the bottom surface of the third portion P13 may be lower than or the same as the top surface of the fin-type pattern F. For example, the second portion P12 and the third portion P13 may be in direct contact with each other, and the surface on which the second portion P12 and the third portion P13 are in contact with each other may be disposed substantially on the same plane as the fin-type pattern F.

As illustrated in FIG. 5, the first gate electrode 120 on the fin-type pattern F may be similar to a third portion (P13 of FIG. 3a) of the first gate electrode 120 on the field insulating film 110. That is, the width of the first gate electrode 120 on the fin-type pattern F may increase or may be substantially constant with distance from the fin-type pattern F.

The first gate electrode 120 may include a conductive material. In some embodiments, the first gate electrode 120 may be formed by stacking a plurality of conductive materials. The first gate electrode 120 may include a metal layer. For example, the first gate electrode 120 may include at least one of Ti, Ta, W, Al, Co, or a combination thereof. Further, for example, the first gate electrode 120 may be formed of silicon, silicon germanium or the like, other than metal.

The first gate electrodes 120 may be formed through, for example, a replacement process, but the present disclosure is not limited thereto.

The first gate insulating film 130 may be interposed between the fin-type pattern F and the first gate electrode 120. That is, the first gate insulating film 130 may be formed on the fin-type pattern F exposed by the field insulating film 110. Further, the first gate insulating film 130 may be interposed between the first gate electrode 120 and the field insulating film 110.

The first gate insulating film 130 may extend along sidewalls and a bottom surface of the first gate electrode 120. For example, the first gate insulating film 130 may extend substantially conformally along the sidewalls and the bottom surface of the first gate electrode 120.

Since the first gate electrode 120 on the field insulating film 110 may have a triangular flask shape, the first gate insulating film 130 on the field insulating film 110 may also have a triangular flask shape.

The first gate insulating film 130 may include a dielectric material having a dielectric constant higher than that of a silicon oxide layer. For example, the first gate insulating film 130 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof. However, the present disclosure is not limited thereto.

Although it is not illustrated, an interfacial layer may be further formed between the fin-type pattern F and the first gate insulating film 130. The interfacial layer may vary depending on the material of the fin-type pattern F. For example, when the fin-type pattern F includes silicon, the interfacial layer may include silicon oxide ($SiO_2$).

The first gate spacer 140 may be disposed on the sidewalls of the first gate electrode 120 and the sidewalls of the first gate insulating film 130. In some embodiments, the first gate spacer 140 may extend substantially conformally along the sidewalls of the first gate insulating film 130.

Since the first gate electrode 120 and the first gate insulating film 130 on the field insulating film 110 may have a triangular flask shape, the first gate spacer 140 on the field insulating film 110 may have the shape of the sidewalls of the triangular flask.

Although the first gate spacer 140 is illustrated as a single film, the present disclosure is not limited thereto. For example, the first gate spacer 140 may be formed of multi-films.

The first gate spacer 140 may include at least one of silicon nitride (SiN), silicon oxynitride (SiON), silicon oxide ($SiO_2$), and silicon oxycarbonitride (SiOCN).

The epitaxial pattern 150 may be formed on the fin-type pattern F of both sidewalls of the first gate structure GS1. As illustrated in FIG. 5, the fin-type pattern F may include first trench TR1 on both sides of the first gate structure GS1. The epitaxial pattern 150 may be formed to fill the first trench TR1.

In some embodiments, the first trench TR1 may have a concave slope. For example, the first trench TR1 may be a U-shape or a part of the U-shape. Thus, the cross section of the epitaxial pattern 150 intersecting with the second direction Y may be a U-shape or a part of the U-shape.

In some embodiments, the cross section of the epitaxial pattern 150 intersecting with the first direction X may have a polygonal shape, such as a pentagonal shape, a hexagonal shape and/or a diamond shape. For example, as illustrated in FIG. 1, the cross section of the epitaxial pattern 150 intersecting with the first direction X may be a pentagonal shape.

The epitaxial pattern 150 may be electrically insulated from the first gate electrode 120 by the first gate spacer 140. The epitaxial pattern 150 may be included in the source and drain region of the transistor including the first gate electrode 120.

The epitaxial pattern 150 may be an elevated source and drain region. That is, the uppermost part of the epitaxial pattern 150 may protrude upward from the top surface of the fin-type pattern F.

In some embodiments, the epitaxial pattern 150 may be formed of multiple layers. For example, the epitaxial pattern 150 may include a first epitaxial layer 152 and a second epitaxial layer 154.

The first epitaxial layer 152 may be formed on the fin-type pattern F. For example, the first epitaxial layer 152 may be formed by epitaxial growth from the fin-type pattern F. The first epitaxial layer 152 may serve as a seed layer for growing the epitaxial pattern 150. However, in some embodiments, the first epitaxial layer 152 may also be omitted.

The second epitaxial layer 154 may be formed on the fin-type pattern F. For example, the second epitaxial layer 154 may be formed by epitaxial growth from the first epitaxial layer 152. Specifically, the first trench TR1 may be formed on the fin-type pattern F on both sides of the first gate structure GS1. At this time, the second epitaxial layer 154 may be formed to fill the first trench TR1. However, the present disclosure is not limited thereto, and the second epitaxial layer 154 may also be formed on the fin-type pattern F in which the first trench TR1 is not formed.

Each of the first epitaxial layer 152 and the second epitaxial layer 154 is illustrated as a single layer, but the present disclosure is not limited thereto. For example, each of the first epitaxial layer 152 and the second epitaxial layer 154 may be formed of multiple layers.

When the semiconductor device, according to some embodiments, is a PMOS transistor, the epitaxial pattern 150 may include p-type impurity and/or impurities for preventing diffusion of the p-type impurity. For example, the epitaxial pattern 150 may include at least one of B, In, Ga, Al, or a combination thereof as the p-type impurity. For example, the epitaxial pattern 150 may contain C as an impurity for preventing diffusion of the p-type impurity.

When the semiconductor device, according to some embodiments, is a PMOS transistor, the epitaxial pattern 150 may include a compressive stress material. For example, when the fin-type pattern F is Si, the epitaxial pattern 150 may include a substance having a lattice constant larger than that of Si, and may include, for example, SiGe. The compressive stress material may apply a compressive stress to the fin-type pattern F to improve the mobility of carriers in the channel region.

Alternatively, when the semiconductor device according to some embodiments is an NMOS transistor, the epitaxial pattern 150 may contain n-type impurity and/or impurities for preventing diffusion of the n-type impurity. For example, the epitaxial pattern 150 may include at least one of P, Sb, As, or a combination thereof.

Further, when the semiconductor device, according to some embodiments, is an NMOS transistor, the epitaxial pattern 150 may include a tensile stress material. For example, when the fin-type pattern F is Si, the epitaxial pattern 150 may include a substance having a lattice constant smaller than that of Si, and may include, for example, SiC. The tensile stress material may apply a tensile stress to the fin-type pattern F to improve the carrier mobility of the channel region. Alternatively, when the semiconductor device according to some embodiments is an NMOS transistor, the epitaxial pattern 150 may include silicon (Si).

Hereinafter, effects of the semiconductor device according to some embodiments of the present inventive concept will be described with reference to FIGS. 1 to 8.

Figure 6:
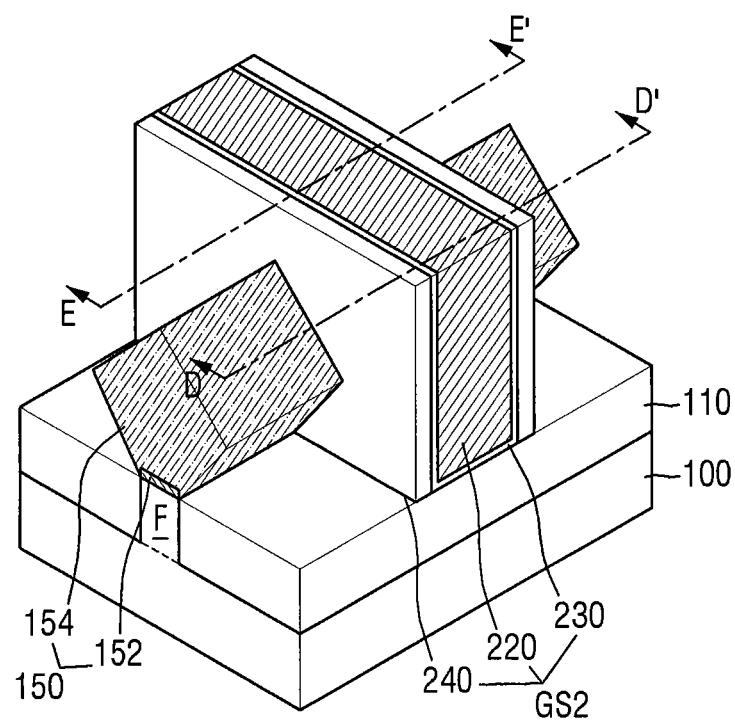
FIG. 6 is a diagram of the semiconductor device, according to some embodiments of the present inventive concept.
Figure 7:
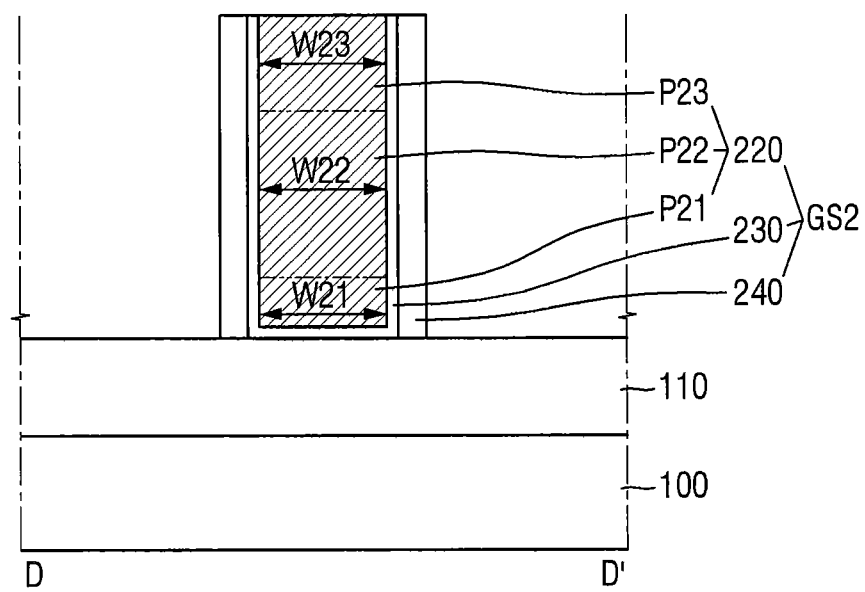
FIG. 7 is a cross-sectional view taken along line D-D' of FIG. 6, according to some embodiments of the present inventive concept.
Figure 8:
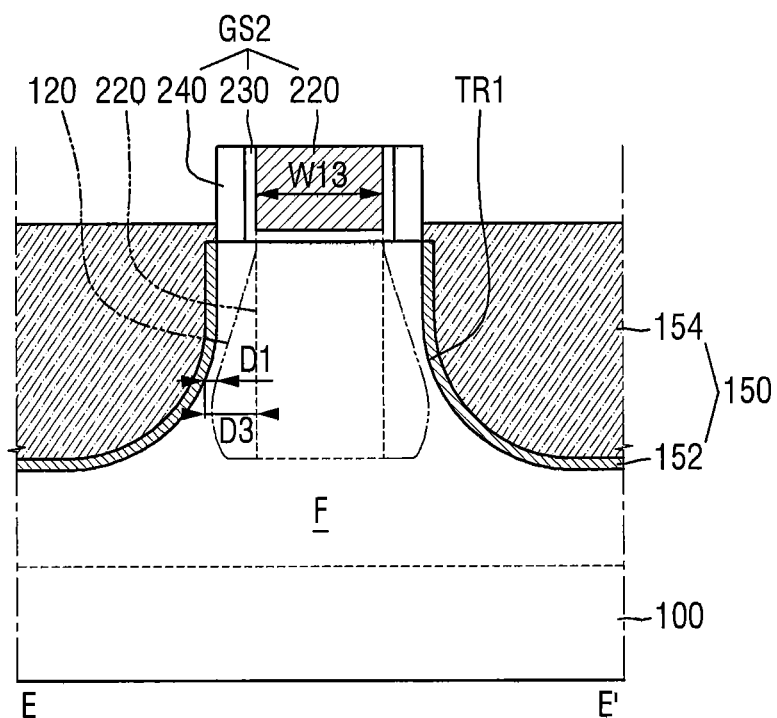
FIG. 8 is a cross-sectional view taken along the line E-E' of FIG. 6, according to some embodiments of the present inventive concept.

FIG. 6 is a diagram of the semiconductor device according to some embodiments of the present inventive concept. FIG. 7 is a cross-sectional view taken along line D-D' of FIG. 6. FIG. 8 is a cross-sectional view taken along the line E-E' of FIG. 6. For the sake of convenience of explanation, repeated portions of those described with reference to FIGS. 1 to 5 will be briefly described or will not be described.

Referring to FIGS. 6 to 8, the semiconductor device according to FIGS. 6 to 8 includes a second gate structure GS2. Unlike the first gate electrode 120 of FIG. 1, the width of the second gate electrode 220 on the field insulating film 110 may be constant.

For example, as illustrated in FIG. 7, the second gate electrode 220 on the field insulating film 110 may include a fourth portion P21, a fifth portion P22, and a sixth portion P23 that are sequentially disposed on the field insulating film 110.

The fourth portion P21 may be disposed below the second gate electrode 220. The fifth portion P22 may be disposed on the fourth portion P21. The sixth portion P23 may be disposed on the fifth portion P22. The width W21 of the fourth portion P21, the width W22 of the fifth portion P22, and the width W23 of the sixth portion P23 may be the same as one another.

In such a case, the proximity between the gate electrode and the source the drain region may be lowered in the lower part of the second gate electrode 220. For example, as illustrated in FIG. 8, when the cross section of the epitaxial pattern 150 intersecting with the second direction Y has a U-shape, the distance D3 between the second gate electrode 220 and the epitaxial pattern 150 may increase in the lower part of the second gate electrode 220.

However, since the first gate electrode 120 according to some embodiments of the present inventive concept has the triangular flask shape, it is possible to prevent a decrease in proximity between the gate electrode and the source and drain region in the lower part of the first gate electrode 120. For example, as illustrated in FIGS. 5 and 8, the distance D1 between the first gate electrode 120 and the epitaxial pattern 150 may be smaller than the distance D3 between the second gate electrode 220 and the epitaxial pattern 150. As a result, the semiconductor device, according to some embodiments of the present inventive concept, may improve the proximity between the gate electrode and the source and drain region to have improved performance.

Since the first gate electrode 120 has the sidewalls having the convex slope in the lower part (e.g., the first portion P11 or the second portion P12) and the crest, it is possible to effectively prevent a problem in which a conductive film is not filled in the lower part of the first gate electrode 120. As a result, the semiconductor device according to some embodiments of the present inventive concept can have improved product reliability. If the sidewalls of the gate electrode have a concave slope or form a tip, a problem in which the conductive film is not properly filled in the lower part of the gate electrode may occur.

Since the width of the upper part (e.g., the third portion P13) of the first gate electrode 120 increases or is substantially the same with distance from the field insulating film 110, it is possible to effectively prevent a problem in which the conductive film is not filled in the upper part of the first gate electrode 120. As a result, the semiconductor device according to some embodiments of the present inventive concept may have improved product reliability. If the width of the upper part of the gate electrode decreases with distance from the field insulating film 110, a problem in which the conductive film is not properly filled in the gate electrode due to the narrow entrance may occur.

Figure 9:
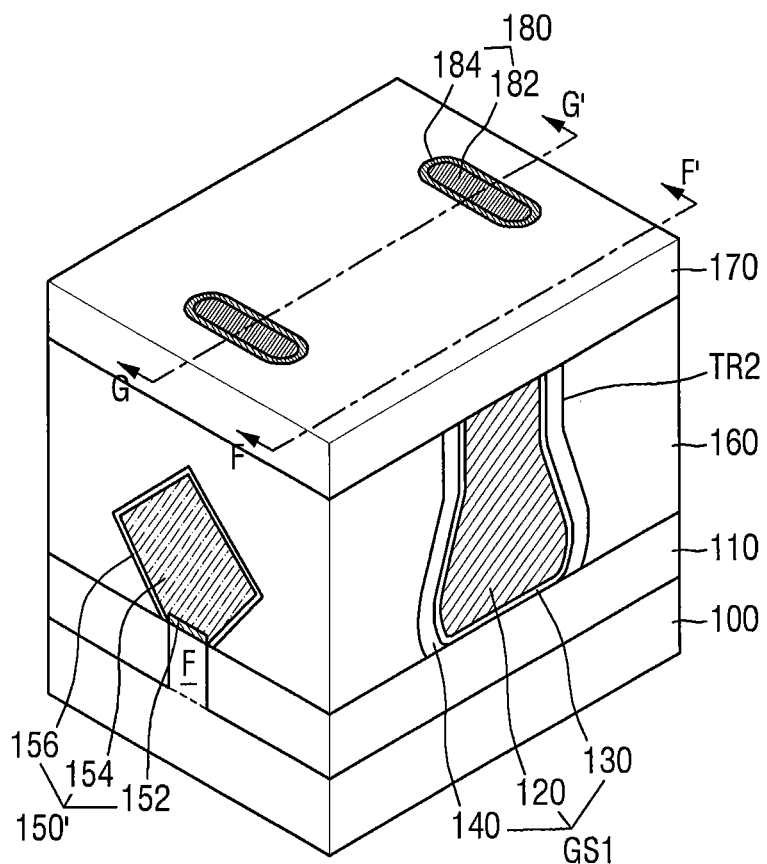
FIG. 9 is a perspective view of a semiconductor device, according to some embodiments of the present inventive concept.
Figure 10:
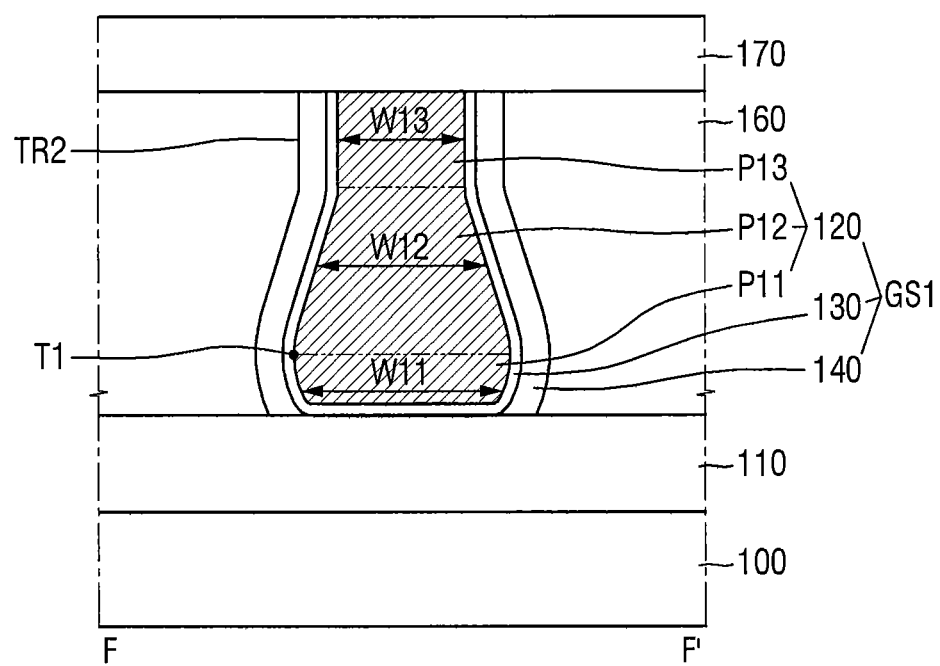
FIG. 10 is a cross-sectional view taken along line F-F' of FIG. 9, according to some embodiments of the present inventive concept.
Figure 11:
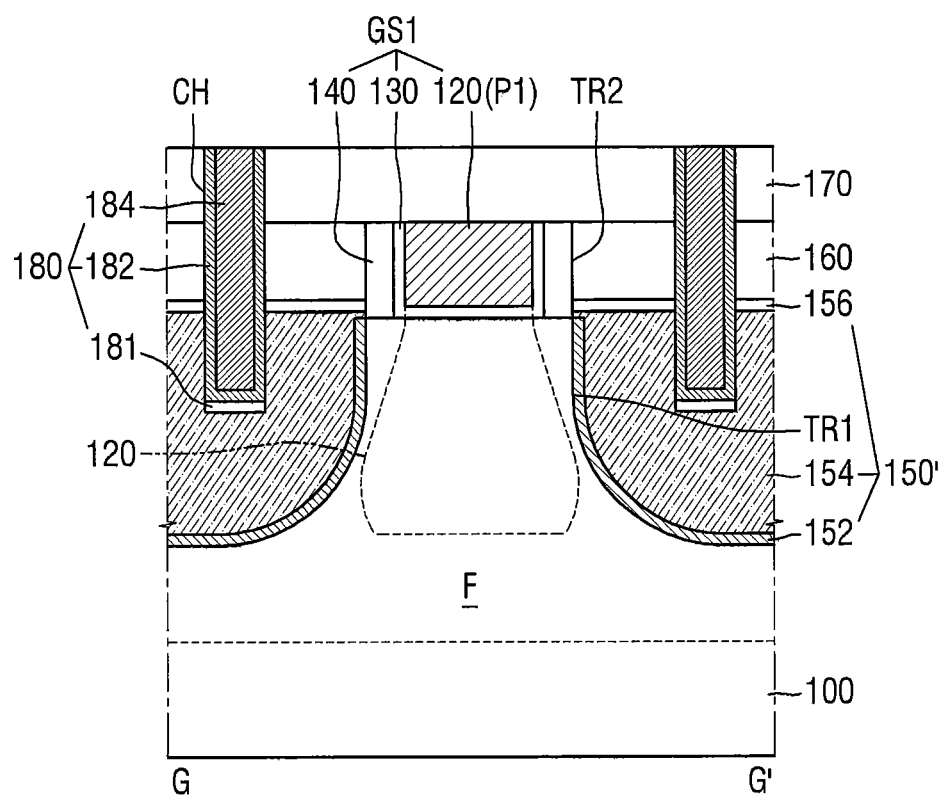
FIG. 11 is a cross-sectional view taken along line G-G' of FIG. 9, according to some embodiments of the present inventive concept.
Figure 11:
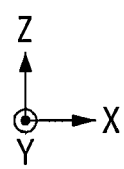

FIG. 9 is a perspective view of a semiconductor device according to some embodiments of the present inventive concept. FIG. 10 is a cross-sectional view taken along line F-F' of FIG. 9. FIG. 11 is a cross-sectional view taken along line G-G' of FIG. 9. For the sake of convenience of explanation, repeated parts of those described with reference to FIGS. 1 to 8 will be briefly described or will not be described.

Referring to FIGS. 9 to 11, a semiconductor device according to some embodiments of the present inventive concept further includes a protective layer 156, a first interlayer insulating film 160, a second interlayer insulating film 170, and a contact 180.

The protective layer 156 may be formed to cover an epitaxial pattern 150'. For example, the protective layer 156 may be formed along the profile of the epitaxial pattern 150'.

When the semiconductor device according to some embodiments is a PMOS transistor, the protective layer 156 may not contain Ge which is a compressive stress material. The protective layer 156 may protect the epitaxial pattern 150' or may adjust the etching quantity of the epitaxial pattern 150' in the process of forming the contact 180 on the epitaxial pattern 150'.

As illustrated in FIGS. 9 and 11, the contact 180 may include a silicide film 181, a first contact conductive film 182, and a second contact conductive film 184. The contact 180 may electrically connect the epitaxial pattern 150' to the wiring.

The silicide film 181 is formed on the lower surface of the contact 180 and may be in contact with the epitaxial pattern 150'. The silicide film 181 may include, for example, Pt, Ni, Co or the like, but the present disclosure is not limited thereto.

The first contact conductive film 182 may be formed on the silicide film 181 along the sidewalls and the bottom surface of the contact hole CH. The second contact conductive film 184 can be formed to fill the remaining parts of the contact hole CH. The contact hole CH is illustrated as being formed by penetrating a part of the epitaxial pattern 150', but the present disclosure is not limited thereto. For example, the lower surface of the contact hole CH may be formed along the top surface of the second epitaxial layer 154 or the top surface of the protective layer 156.

The first contact conductive film 182 may include, for example, Ti or at least one of TiN, Ta, TaN, and WN, and the second contact conductive film 184 may include, for example, W, Al, Co, Cu, or the like. However, the present disclosure is not limited thereto.

The first interlayer insulating film 160 may be disposed on the field insulating film 110. The first interlayer insulating film 160 may be formed to cover the epitaxial pattern 150' and to cover a part of the sidewalls of the contact 180. Further, the first interlayer insulating film 160 may be formed to cover the sidewalls of the first gate structure GS1.

For example, the first interlayer insulating film 160 may include a second trench TR2 extending along the second direction Y on the fin-type pattern F and the field insulating film 110. At this time, the first gate structure GS1 may be formed to fill the second trench TR2.

As illustrated in FIG. 10, the cross section of the second trench TR2 that intersects with the second direction Y may have a triangular flask shape. The first gate spacer 140 may extend along the sidewalls of the second trench TR2. The first gate insulating film 130 may extend along the sidewalls of the first gate spacer 140 and the bottom surface of the second trench TR2 on the first gate spacer 140. The first gate electrode 120 may fill the second trench TR2 on the first gate insulating film 130. In some embodiments, the first gate spacer 140 and the first gate insulating film 130, which may be a dielectric, may conformally extend.

The top surface of the first interlayer insulating film 160 may be formed to be disposed on the same plane as the top surface of the first gate structure GS1. However, the present disclosure is not limited thereto.

The second interlayer insulating film 170 may be disposed on the first interlayer insulating film 160. Also, the second interlayer insulating film 170 may cover the top surface of the first gate structure GS1 and may cover the remaining sidewalls of the contact 180.

The first interlayer insulating film 160 and the second interlayer insulating film 170 may include, for example, at least one of an oxide film, a nitride film, and an/or oxynitride film, but the present disclosure is not limited thereto.

Figure 12:
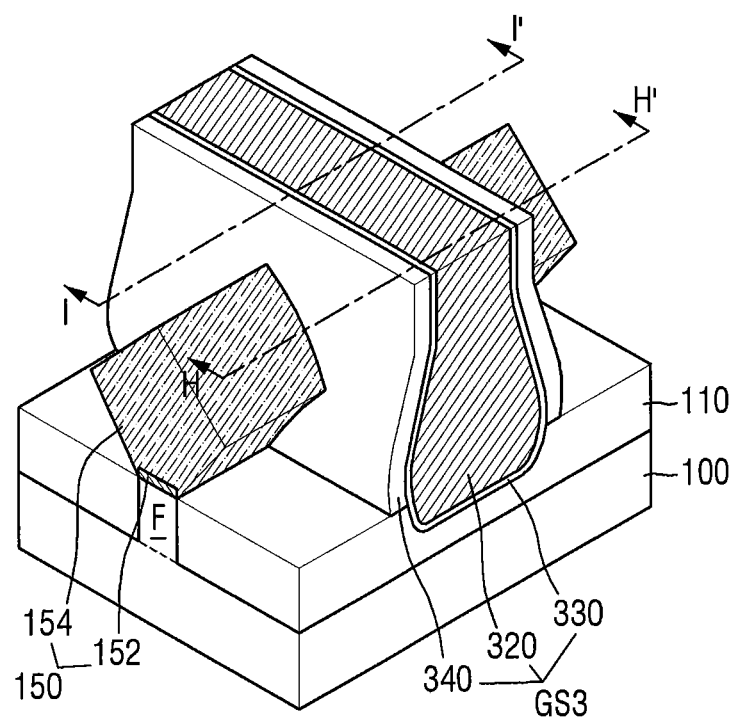
FIG. 12 is a perspective view of a semiconductor device, according to some embodiments of the present inventive concept.
Figure 13:
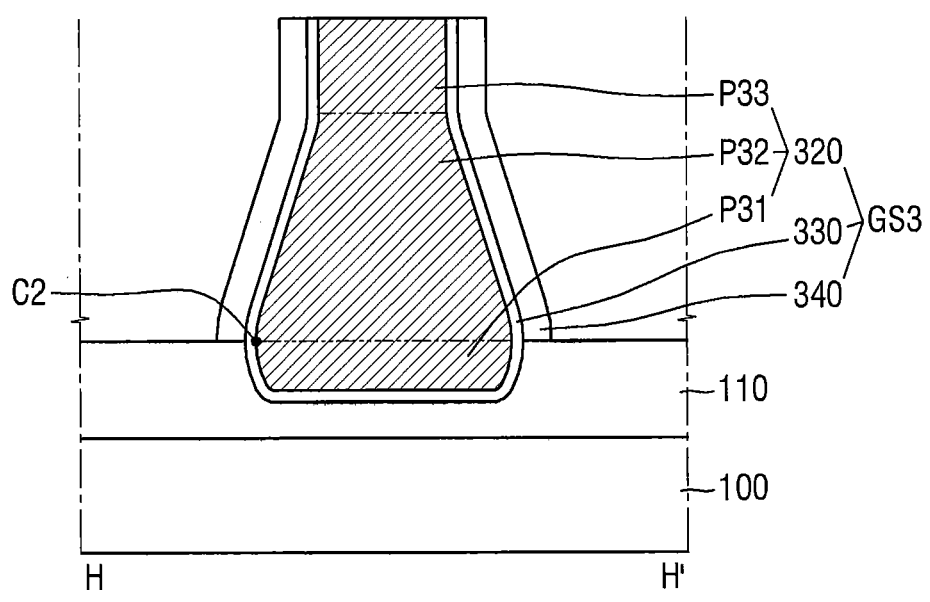
FIG. 13 is a cross-sectional view taken along line H-H' of FIG. 12, according to some embodiments of the present inventive concept.
Figure 14:
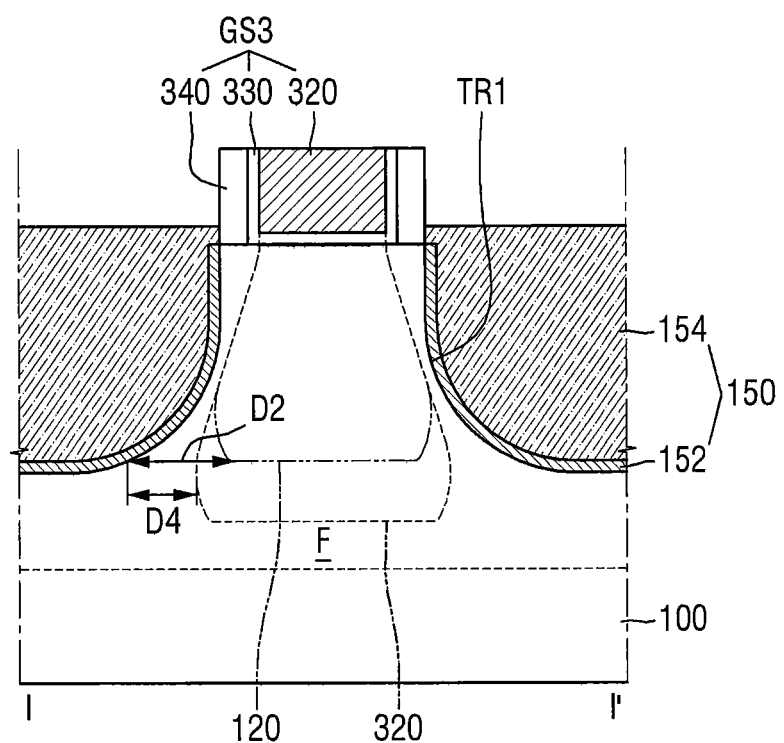
FIG. 14 is a cross-sectional view taken along line I-I of FIG. 12, according to some embodiments of the present inventive concept.

FIG. 12 is a perspective view for explaining a semiconductor device according to some embodiments of the present inventive concept. FIG. 13 is a cross-sectional view taken along line H-H' of FIG. 12. FIG. 14 is a cross-sectional view taken along line I-I of FIG. 12. For the sake of convenience of explanation, repeated portions of those described with reference to FIGS. 1 to 5 will be briefly explained or will not be described.

Referring to FIGS. 12 to 14, the semiconductor device according to some embodiments of the present inventive concept includes a third gate structure GS3. The third gate structure GS3 may include a third gate electrode 320, a third gate insulating film 330, and a third gate spacer 340.

As compared with the first gate structure GS1 of FIG. 1, the third gate structure GS3 is substantially the same as the first gate structure GS1 except that the third gate electrode 320 and the third gate insulating film 330 further extend to the inside of the field insulating film 110.

Specifically, as illustrated in FIG. 13, the third gate electrode 320 on the field insulating film 110 may have a triangular flask shape. For example, the third gate electrode 320 on the field insulating film 110 may include a first portion P31, a second portion P32 and a third portion P32 that are sequentially disposed on the field insulating film 110.

In some embodiments, the third gate electrode 320 and the third gate insulating film 330 may further extend downward from the bottom surface of the third gate spacer 340. That is, the bottom surface of the first portion P31 may be disposed to be lower than the bottom surface of the third gate spacer 340. As a result, a part of the top surface of the field insulating film 110 may be disposed to be lower than the bottom surface of the third gate spacer 340.

Also, in some embodiments, the first portion P31 may be disposed to be lower than the bottom surface of the third gate spacer 340, and the second portion P32 may be disposed to be higher than the bottom surface of the third gate spacer 340. That is, the top surface of the first portion P31 may be lower than or the same as the bottom surface of the third gate spacer 340, and the bottom surface of the second portion P32 may be higher than or the same as the bottom surface of the third gate spacer 340. For example, the first portion P31 and the second portion P32 may be in direct contact with each other, and the surface on which the first portion P31 and the second portion P32 are in contact with each other may be disposed on substantially the same plane as the bottom surface of the third gate spacer 340.

Further, the sidewalls of the third gate electrode 320 may include a crest. For example, as illustrated in FIG. 13, the first portion P31 and the second portion P32 may be in direct contact with each other. At this time, a second crest C2 may be formed at a point of the sidewall of the third gate electrode 320 in which the first portion P31 and the second portion P32 are in contact with each other. The second crest C2 may be a portion protruding farthest in the first direction X from the sidewall of the third gate electrode 320 having a convex slope. The second crest C2 may be at a widest part of a trench that includes the gate electrode.

In some embodiments, the second crest C2 may be disposed on the substantially same plane as the bottom surface of the third gate spacer 340, but the present disclosure is not limited thereto.

When the third gate electrode 320 further extends downward from the bottom surface of the third gate spacer 340, the proximity between the gate electrode, the source and/or the drain region can be further improved. For example, as illustrated in FIG. 14, the distance D4 between the third gate electrode 320 and the epitaxial pattern 150 under the gate electrode may be shorter than the distance D2 between the first gate electrode 120 and the epitaxial pattern 150. As a result, the semiconductor device, according to some embodiments of the present inventive concept, can have further improved performance.

Figure 15:
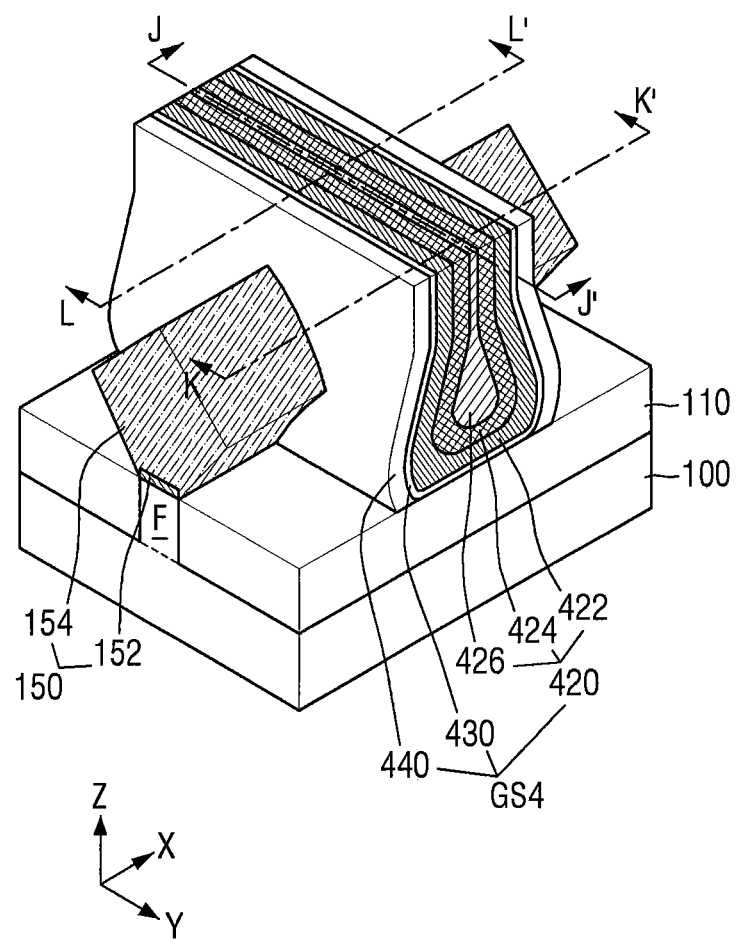
FIG. 15 is a perspective view of a semiconductor device, according to some embodiments of the present inventive concept.
Figure 16:
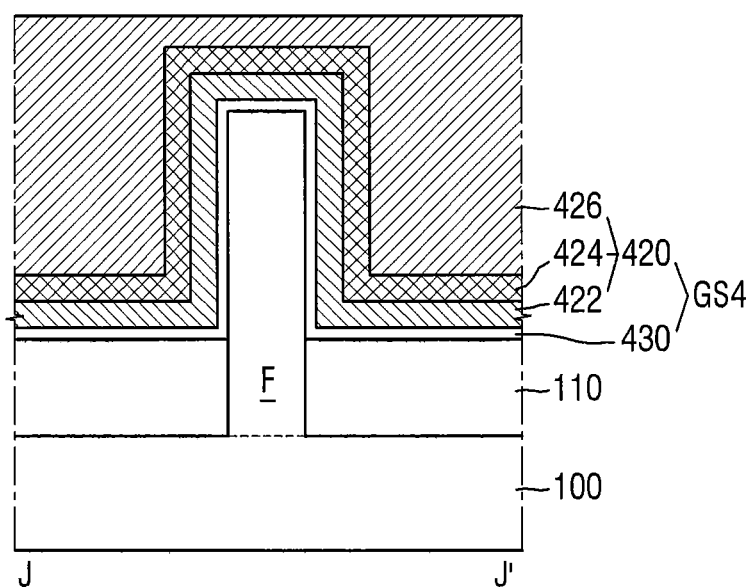
FIG. 16 is a cross-sectional view taken along line J-J' of FIG. 15, according to some embodiments of the present inventive concept.
Figure 17:
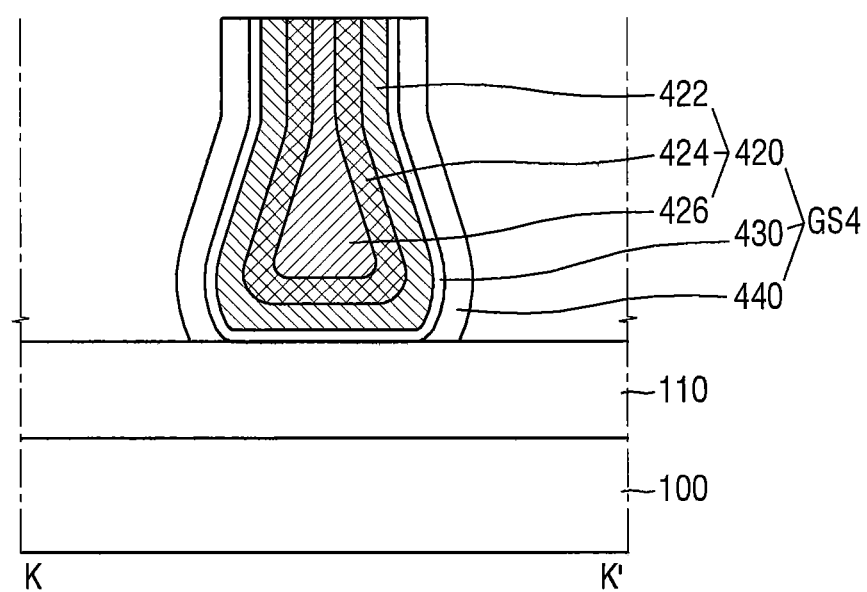
FIG. 17 is a cross-sectional view taken along line K-K' of FIG. 15, according to some embodiments of the present inventive concept.
Figure 18:
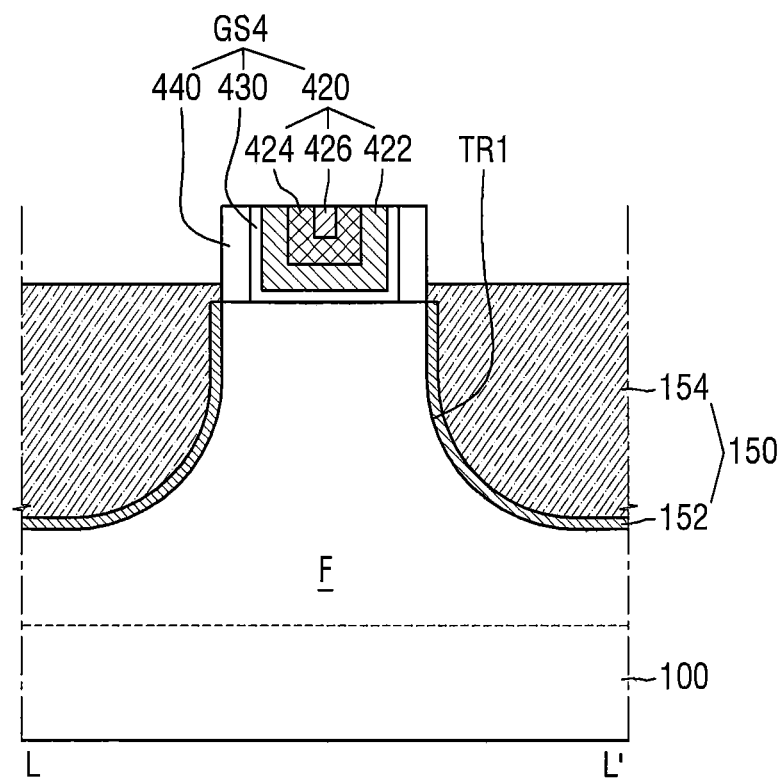
FIG. 18 is a cross-sectional view taken along line L-L' of FIG. 15, according to some embodiments of the present inventive concept.

FIG. 15 is a perspective view for explaining a semiconductor device according to some embodiments of the present inventive concept. FIG. 16 is a cross-sectional view taken along line J-J' of FIG. 15. FIG. 17 is a cross-sectional view taken along line K-K' of FIG. 15. FIG. 18 is a cross-sectional view taken along line L-L' of FIG. 15. For the sake of convenience of explanation, repeated portions of those described with reference to FIGS. 1 to 8 will be briefly described or will not be described.

Referring to FIGS. 15 to 18, the semiconductor device according to some embodiments of the present inventive concept includes a fourth gate structure GS4. The fourth gate structure GS4 may include a fourth gate electrode 420, a fourth gate insulating film 430, and a fourth gate spacer 440.

As compared with the first gate structure GS1 of FIG. 1, the fourth gate structure GS4 is substantially the same as the first gate structure GS1 except that the fourth gate electrode 420 includes a plurality of conductive films.

For example, the fourth gate electrode 420 may include a first work function adjustment film 422, a second work function adjustment film 424, and a barrier conductive film 426.

The first work function adjustment film 422 may extend along the sidewalls and the bottom surface of the fourth gate insulating film 430. The second work function adjustment film 424 may extend along the sidewalls and the bottom surface of the first work function adjustment film 422 and/or on the first work function adjustment film 422.

The first work function adjustment film 422 and the second work function adjustment film 424 may adjust the work function. Each of the first work function adjustment film 422 and the second work function adjustment film 424 may include, for example, at least one of TiN, TaN, TiC, TaC and TiAlC.

The barrier conductive film 426 may fill a space formed by the first work function adjustment film 422 and the second work function adjustment film 424. The barrier conductive film 426 may include, for example, W or Al.

The fourth gate electrode 420 may be formed through, for example, a replacement process, but the present disclosure is not limited thereto.

Figure 19:
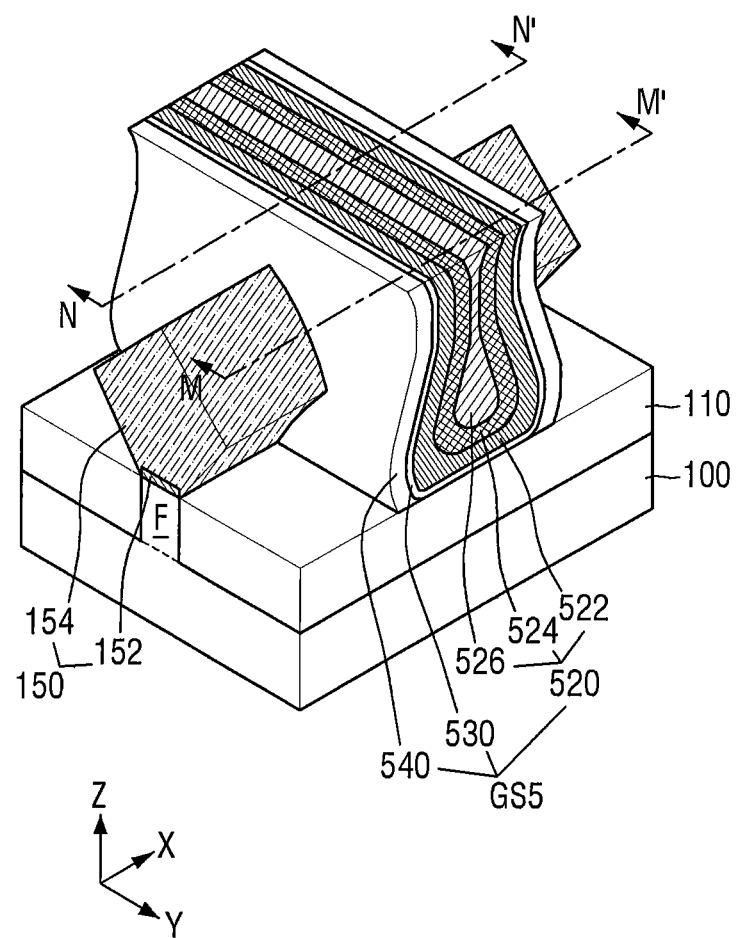
FIG. 19 is a perspective view of the semiconductor device, according to some embodiments of the present inventive concept.
Figure 20:
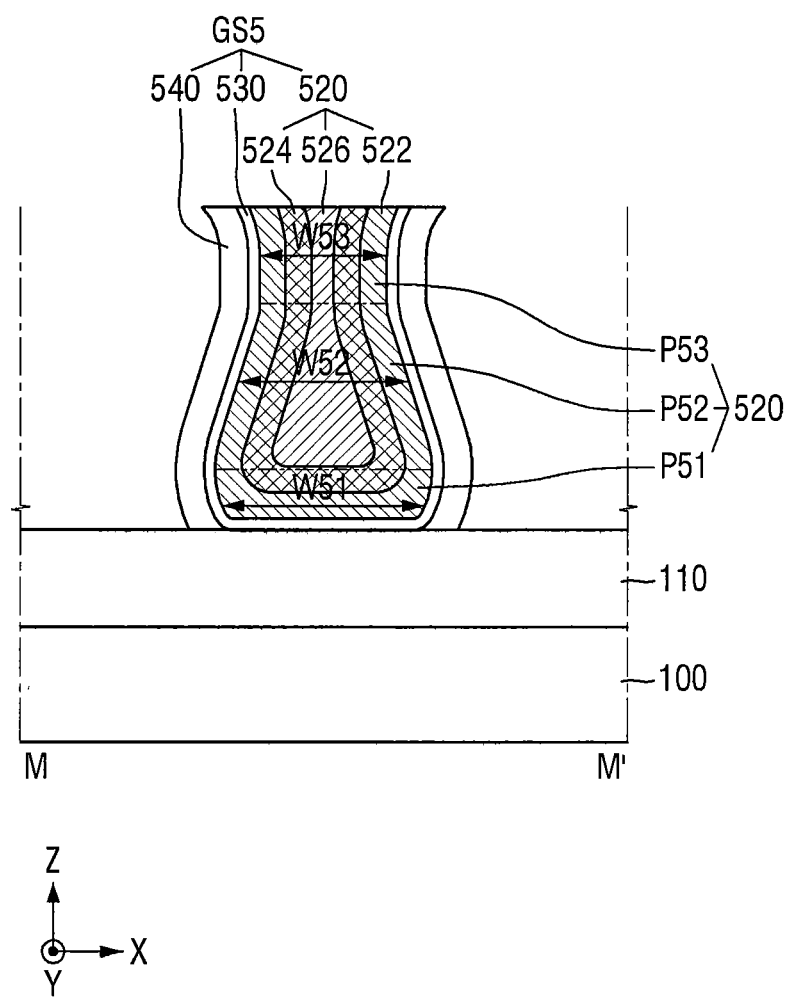
FIG. 20 is a cross-sectional view taken along line M-M' of FIG. 19, according to some embodiments of the present inventive concept.
Figure 21:
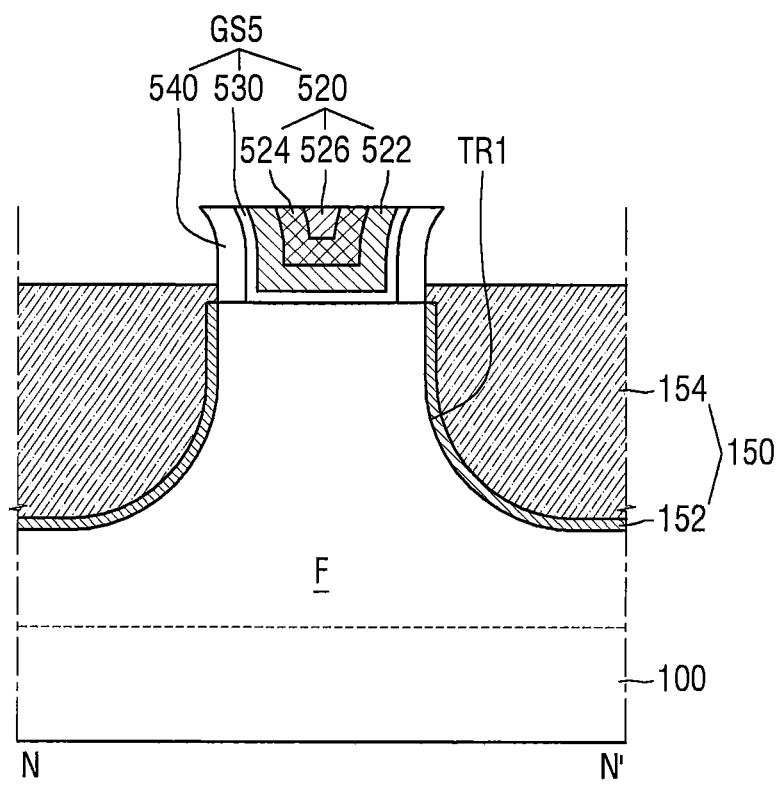
FIG. 21 is a cross-sectional view taken along line N-N' of FIG. 19, according to some embodiments of the present inventive concept.

FIG. 19 is a perspective view of the semiconductor device according to some embodiments of the present inventive concept. FIG. 20 is a cross-sectional view taken along line M-M' of FIG. 19. FIG. 21 is a cross-sectional view taken along line N-N' of FIG. 19. For the sake of convenience of explanation, repeated portions of those described with reference to FIGS. 1 to 8 will be briefly described or will not be described.

Referring to FIGS. 19 to 21, the semiconductor device according to some embodiments of the present inventive concept includes a fifth gate structure GS5. The fifth gate structure GS5 may include a fifth gate electrode 520, a fifth gate insulating film 530, and a fifth gate spacer 540. Further, the fifth gate electrode 520 may include a first work function adjustment film 522, a second work function adjustment film 524, and a barrier conductive film 526.

As compared with the fourth gate structure GS4 of FIG. 15, the fifth gate structure GS5 is substantially the same as the fourth gate structure GS4 except that the width of the upper part of the fifth gate structure GS5 increases with distance from the field insulating film 110.

As illustrated in FIG. 20, the fifth gate electrode 520 on the field insulating film 110 may have a triangular flask shape. For example, the fifth gate electrode 520 on the field insulating film 110 has a first portion P51, a second portion P52 and a third portion P53 that are sequentially arranged on the field insulating film 110.

In some embodiments, the width of the third portion P53 may increase as it goes away from the field insulating film 110. Also, in some embodiments, the sidewall of the third portion P53 may have a concave slope. At this time, since the width of the third portion P53 increases with distance from the field insulating film 110, an absolute value of a slope formed by the sidewall of the third portion P53 may decrease with distance from the field insulating film 110.

In the case where the gate electrode includes a plurality of conductive films, a problem in which the conductive film is not properly filled in the gate electrode may occur. In particular, since an entrance filled with the conductive film is narrow, such a problem may be further intensified in the conductive film to be filled thereafter.

However, since the width of the upper part (for example, the third portion P53) of the fifth gate electrode 520 increases with distance from the field insulating film 110, it is possible to effectively prevent a problem in which the conductive film is not filled in the fifth gate electrode 520. For example, in the process of forming the barrier conductive film 526, since the entrance filled with the barrier conductive film 526 is narrow in the fifth gate electrode 520, it is possible to effectively prevent the phenomenon in which an empty region is formed inside the fifth gate electrode 520.

While the present inventive concept has been particularly illustrated and described with reference to example embodiments thereof, it will be understood by those of ordinary skill in the art that various changes in form and detail may be made therein without departing from the spirit and scope of the present inventive concept as defined by the following claims. The example embodiments should be considered in a descriptive sense only and not for purposes of limitation.

What is claimed is:

1. A semiconductor device comprising:
   a fin-type pattern;
   a field insulating film on a part of a sidewall of the fin-type pattern; and
   a gate electrode on the fin-type pattern and the field insulating film,
   wherein the gate electrode intersects the fin-type pattern,
   wherein the gate electrode comprises a first portion, a second portion, and a third portion that are on the field insulating film,
   wherein a first width of the first portion increases as a first distance from the field insulating film increases,
   wherein a second width of the second portion decreases as a second distance from the field insulating film increases,
   wherein a third width of the third portion increases or is substantially constant as a third distance from the field insulating film increases,
   wherein the first distance is less than the second distance and the second distance is less than the third distance,
   wherein a bottom surface of the first portion of the gate electrode is lower than a top surface of the field insulating film,
   wherein the gate electrode has a crest formed at a widest width of the gate electrode,
   wherein the crest is disposed on substantially the same plane as the top surface of the field insulating film, and
   wherein a sidewall of the gate electrode at the crest is a curved surface.

2. The semiconductor device of claim 1, wherein the first portion comprises a first sidewall having a convex slope.

3. The semiconductor device of claim 2,
   wherein the second portion comprises a second sidewall having a convex slope, and
   wherein the first sidewall and the second sidewall are in contact with each other.

4. The semiconductor device of claim 1, wherein at least a part of a third sidewall of the third portion has a concave slope.

5. The semiconductor device of claim 1, wherein at least a part of the second portion is lower than a top surface of the fin-type pattern, and
   the third portion is higher than the top surface of the fin-type pattern.

6. The semiconductor device of claim 1,
   wherein a fourth width of the gate electrode on the fin-type pattern increases as a fourth distance from the field insulating film increases, and
   wherein the third distance is less than the fourth distance.

7. The semiconductor device of claim 1, further comprising:
   an epitaxial pattern,
   wherein the fin-type pattern comprises a first trench having a concave slope adjacent the fin-type pattern, and
   wherein the epitaxial pattern fills the first trench.

8. The semiconductor device of claim 1, further comprising:
   a gate insulating film extending along sidewalls and/or a bottom surface of the gate electrode; and
   a gate spacer on a sidewall of the gate insulating film.

9. The semiconductor device of claim 8, wherein the gate insulating film conformally extends along the sidewalls and the bottom surface of the gate electrode, and the gate spacer conformally extends along the sidewall of the gate insulating film.

10. The semiconductor device of claim 8, wherein the bottom surface of the first portion of the gate electrode is lower than a bottom surface of the gate spacer.

11. The semiconductor device of claim 1, further comprising:
    an interlayer insulating film on the fin-type pattern and on the field insulating film,
    wherein the interlayer insulating film comprises a second trench that intersects with the fin-type pattern, and
    wherein the gate electrode comprises a first work function adjustment film which extends along sidewalls and a bottom surface of the second trench, and a barrier conductive film on the first work function adjustment film.

12. The semiconductor device of claim 11, wherein the gate electrode further comprises a second work function adjustment film between the first work function adjustment film and the barrier conductive film.

13. A semiconductor device comprising:
    a fin-type pattern extending along a first direction;
    a field insulating film on a part of a sidewall of the fin-type pattern;
    an interlayer insulating film on the field insulating film and surrounding including a trench on the fin-type pattern, the trench extending along a second direction intersecting with the first direction and comprising a triangular flask-shaped cross-section;
    a gate spacer extending along a sidewall of the trench;
    a gate insulating film extending along a sidewall of the gate spacer and a bottom surface of the trench; and
    a gate electrode on the gate insulating film,
    wherein a bottom surface of the gate electrode is lower than a bottom surface of the gate spacer,
    wherein the gate electrode has a crest formed at a widest width of the gate electrode,
    wherein the crest is disposed on substantially the same plane as the bottom surface of the gate spacer, and
    wherein a sidewall of the gate electrode at the crest is a curved surface.

14. The semiconductor device of claim 13, wherein the gate spacer and the gate insulating film conformally extend in the trench.

15. The semiconductor device of claim 13, wherein the gate electrode on the field insulating film comprises a first portion, a second portion, and a third portion on the field insulating film,
    a first width of the first portion increases as a first distance from the field insulating film increases,
    a second width of the second portion decreases as a second distance the field insulating film increases, and
    a third width of the third portion increases or is substantially constant as a third distance from the field insulating film increases,
    wherein the first distance is less than the second distance and the second distance is less than the third distance.

16. The semiconductor device of claim 13, wherein the gate electrode comprises a first work function adjustment film extending along a sidewall and a bottom surface of the gate insulating film, and a barrier conductive film on the first work function adjustment film.

17. A semiconductor device comprising:
    a fin-type pattern;
    a field insulating film on a part of sidewalls of the fin-type pattern; and
    a gate electrode on the field insulating film, wherein a cross section of the gate electrode has a triangular flask shape, wherein sidewalls of the gate electrode comprise a crest, wherein a bottom surface of the gate electrode is lower than a top surface of the field insulating film, wherein the gate electrode has a crest formed at a widest width of the gate electrode, wherein the crest is disposed on substantially the same plane as the top surface of the field insulating film, and wherein a sidewall of the gate electrode at the crest is a curved surface.

18. The semiconductor device of claim 17, further comprising:
   a gate insulating film extending along a sidewall and a bottom surface of the gate electrode; and
   a gate spacer on the sidewall of the gate electrode and a sidewall of the gate insulating film.

19. The semiconductor device of claim 18,
   wherein the gate insulating film conformally extends along the sidewall and the bottom surface of the gate electrode, and
   the gate spacer conformally extends along the sidewall of the gate insulating film.

* * * * *